United States Patent [19]
Liu et al.

[11] Patent Number: 5,968,610
[45] Date of Patent: Oct. 19, 1999

[54] MULTI-STEP HIGH DENSITY PLASMA CHEMICAL VAPOR DEPOSITION PROCESS

[75] Inventors: Chih-Chien Liu; Kuen-Jian Chen, both of Taipei; Yu-Hao Chen; J. Y. Wu, both of Hsin-Chu City; Water Lur; Shih-Wei Sun, both of Taipei, all of Taiwan

[73] Assignee: United Microelectronics Corp., Hsin-Chu, Taiwan

[21] Appl. No.: 08/959,407

[22] Filed: Oct. 28, 1997

Related U.S. Application Data

[60] Provisional application No. 60/041,789, Apr. 2, 1997.

[51] Int. Cl.$^6$ .............................. B05D 3/06; H01L 21/76
[52] U.S. Cl. ...................... 427/579; 427/99; 427/255.37; 427/255.7; 438/788; 438/792; 438/435; 438/437; 438/702; 438/763
[58] Field of Search ..................................... 427/579, 578, 427/255.7, 99, 255.37; 438/786, 788, 792, 435, 437, 702, 763

[56] References Cited

U.S. PATENT DOCUMENTS

| | | | |
|---|---|---|---|
| 5,726,090 | 3/1998 | Jang et al. | 438/435 |
| 5,804,259 | 9/1998 | Robles | 427/577 |
| 5,814,564 | 9/1998 | Yao et al. | 438/723 |
| 5,817,567 | 10/1998 | Jang et al. | 438/427 |

OTHER PUBLICATIONS

J.T. Pye, et al., "High–Density Plasma CVD and CMP for 0.25–$\mu$m Intermetal Dielectric Processing," Solid State Technology, Dec. 1995, pp. 65–69.

*Primary Examiner*—Roy V. King
*Attorney, Agent, or Firm*—Rabin & Champagne, P.C.

[57] ABSTRACT

A method for depositing dielectric material into gaps between wiring lines in the formation of a semiconductor device includes the deposition of three oxide layers using high density plasma chemical vapor deposition (HDPCVD). A first HDPCVD step is carried out while keeping the substrate unbiased to form an oxide layer over the lines and in the gap. A second HDPCVD step in which the substrate is biased deposits a second oxide layer over the first oxide layer. During the second HDPCVD step some etching occurs and a portion of the first oxide layer is removed. A third HDPCVD step is carried out at a greater etch and sputtering rate than the second step to complete filling of the gap with dielectric material. The first oxide layer acts to protect the underlying structures from etching damage during the third step. Gaps between wiring lines can be filled with dielectric material without forming voids, even for high aspect ratio gaps.

22 Claims, 4 Drawing Sheets

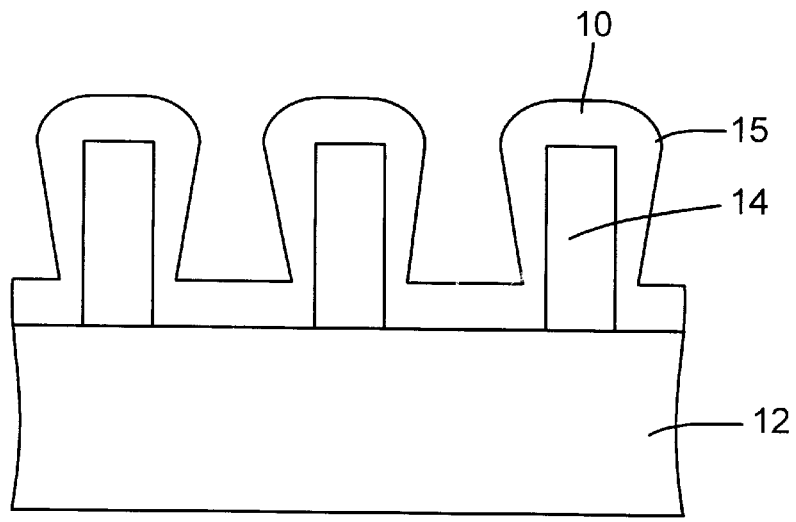
FIG. 1 - Prior Art
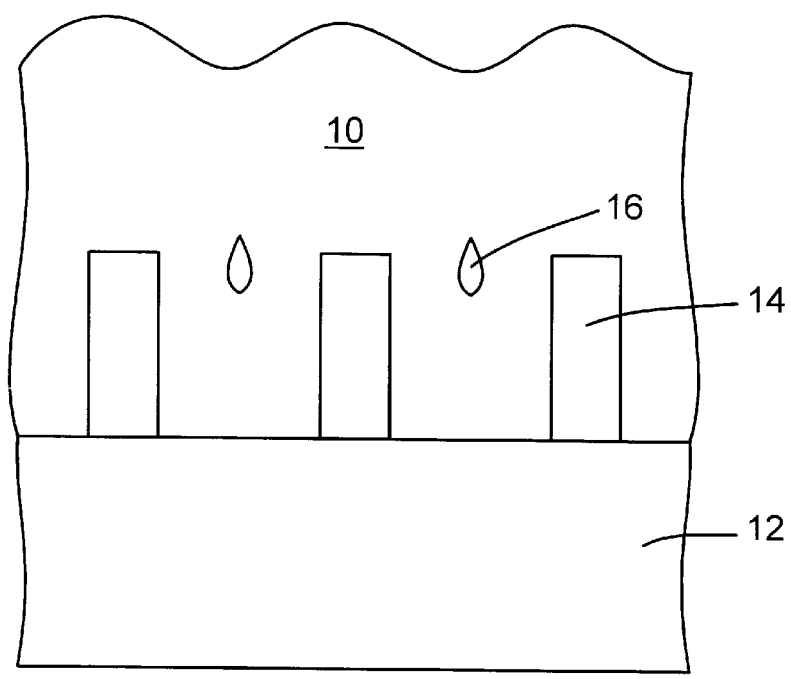
FIG. 2 - Prior Art

MULTI-STEP HIGH DENSITY PLASMA CHEMICAL VAPOR DEPOSITION PROCESS

This application claims priority from provisional application Ser. No. 60/041,789, filed Apr. 2, 1997.

BACKGROUND OF THE INVENTION

1. Field of the Invention

The present invention relates to a high density plasma chemical vapor deposition process for filling the gaps between conductive regions in a semiconductor circuit with a dielectric material.

2. Description of the Related Art

Intermetal dielectric layers are generally used to separate and electrically isolate wiring lines and other conductors in semiconductor circuit devices. Such devices may include multiple layers of wiring lines and other conductors and require isolation between adjacent conducting structures and isolation between layers. As devices are being scaled down to smaller geometries, the gaps between wiring lines generally have higher aspect ratios (ratio of height to width), which are harder to fill than small aspect ratio gaps. In addition, as the distance between wiring lines and other conductors becomes smaller, capacitive coupling between wiring lines and other conductors becomes a limitation on the speed of the integrated circuit device. For adequate device performance in reduced dimension devices, it is necessary for the dielectric provided between wiring lines to meet a number of requirements. The dielectric material should be able to completely fill the gap between conductors and should be planarizable so that successive layers can be deposited and processed. The dielectric material should also be resistant to moisture transport and have a low dielectric constant to minimize wiring capacitance between conductors and between layers.

It is thus important to deposit a high quality, substantially void-free dielectric that can fill the small, high-aspect ratio gaps between wiring lines. Dielectric layers for wiring line isolation are often formed by chemical vapor deposition (CVD) processes, which deposit material onto a surface by transporting certain gaseous precursors to the surface and causing the precursors to react at the surface. Common CVD methods include atmospheric-pressure CVD (APCVD), low-pressure CVD (LPCVD) and plasma-enhanced CVD (PECVD). High quality APCVD and LPCVD oxides may be deposited at high temperatures (650–850° C.), but such temperatures are generally not compatible with preferred wiring materials such as aluminum. Lower temperature APCVD and LPCVD processes tend to yield oxides that are comparatively more porous and water absorbing and that may be poorly suited to use as intermetal dielectrics. Acceptable oxides may be formed using PECVD processes, which use a plasma to impart additional energy to the reactant gases. The additional energy supplied by the plasma enables PECVD processes to be carried out at lower temperatures (approximately 400° C. and less) than APCVD or LPCVD processes.

One known method for depositing dielectric material between wiring lines forms a sandwich of a layer of silane-based or TEOS-based oxide deposited by PECVD together with a layer of spin-on-glass provided in the gaps and over the wiring lines. Another method deposits only a TEOS-based dielectric layer into the gaps and over the wiring lines. Problems relating to moisture absorption, spin-on-glass outgassing and incomplete gap fill in small geometries are observed and are likely to become more problematic for further reductions in device size. Thus, it would be desirable to provide a method for filling small geometry, high aspect-ratio gaps with a dense, high quality dielectric material.

SUMMARY OF THE PREFERRED EMBODIMENTS

One aspect of embodiments of the present invention provides a method of making a semiconductor device isolation structure in which a high density plasma chemical vapor deposition (HDPCVD) process is utilized. Preferably, the deposition process includes distinct steps which are most preferably controlled to both optimize gap filling speed and to protect structures on the device from etching carried out during the deposition process or in other processes.

In certain embodiments of the present invention, structures requiring electrical isolation from each other are provided on a substrate surface, the structures being separated by gaps. A first stage of high density plasma chemical vapor deposition is performed to deposit a first dielectric layer with a first sputtering rate over the structures and into the gaps. A second stage of high density plasma chemical vapor deposition is performed to etch a portion of the first dielectric layer and to deposit a second dielectric layer with a second sputtering rate over the first dielectric layer, wherein the second sputtering rate is greater than the first sputtering rate. A third stage of high density plasma chemical vapor deposition is performed to deposit a third dielectric layer over the second dielectric layer with a third sputtering rate, wherein the third sputtering rate is greater than the second sputtering rate.

In another aspect of embodiments of the present invention, additional HDPCVD dielectric material may be deposited over the third HDPCVD layer. Such additional HDPCVD material provides advantages related to subsequent processing steps such as chemical mechanical polishing for planarization. In yet other aspects of the present invention, a plasma-enhanced CVD dielectric material may be deposited over the third HDPCVD layer.

Embodiments also include a method for depositing dielectric material in the formation of a semiconductor device including providing wiring lines above a substrate, the wiring lines separated by gaps. A first dielectric layer is formed over the wing lines and gaps in a process characterized by a first sputtering rate. A second dielectric layer is formed using high density plasma chemical vapor deposition, characterized by a second sputtering rate, over at least a portion of the first dielectric layer, where in the second sputtering rate is greater than the first sputtering rate. A third dielectric layer is formed using high density plasma chemical vapor deposition, characterized by a third sputtering rate, over at least a portion of the second dielectric layer, wherein the third etch rate is greater than the second sputtering rate. The gaps between structures are filled with dielectric material comprising the first, second and third dielectric layers.

BRIEF DESCRIPTION OF THE DRAWINGS

Embodiments of the invention are described with reference to the accompanying drawings which, for illustrative purposes, are schematic and are not drawn to scale, where:

FIG. 1 illustrates the formation of a plasma-enhanced TEOS oxide layer as an intermetal layer, showing the formation of the oxide layer on the wiring lines and within the gaps between wiring lines, according to prior art deposition techniques.

FIG. 2 illustrates the formation of voids in a plasma-enhanced TEOS oxide layer according to prior art deposition techniques.

DESCRIPTION OF THE PREFERRED EMBODIMENTS

Figure 3:
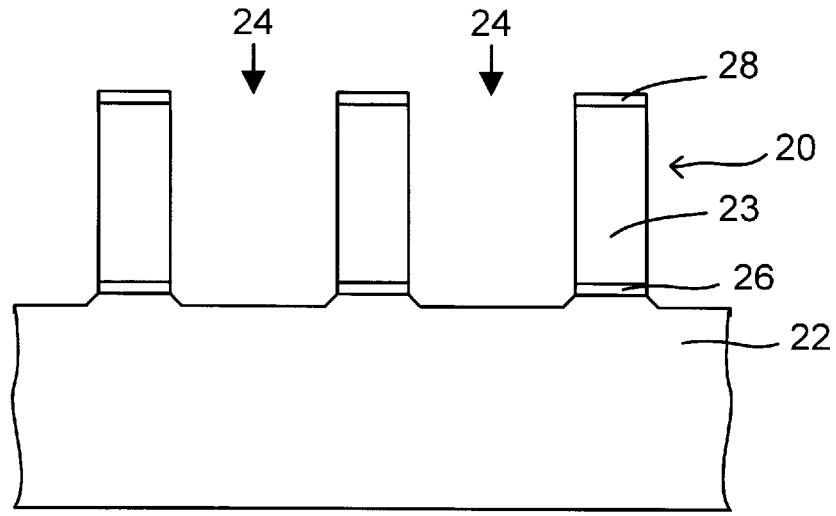
FIGS. 3, 4, 5, 6 and 7 illustrate the processing steps in the formation of an integrated circuit device including filling the gap between wiring lines according to embodiments of the present invention.

As devices are being scaled down to smaller geometries, conventional CVD techniques cannot adequately fill the high aspect ratio gaps between wiring lines (or other conducting structures) on a substrate surface. Conventional techniques such as PECVD tend to deposit material in a manner so that voids become enclosed between the wiring lines. Such voids may be uncovered during subsequent processing and result in contamination that can damage wiring lines or contacts, diminishing device performance.

Preferred embodiments of the present invention utilize high density plasma chemical vapor deposition (HDPCVD) to fill the gaps between wiring lines. HDPCVD allows for the addition of a sputter component to a plasma deposition process which can be controlled to promote gap-filling during deposition processes in a manner superior to conventional CVD processes. According to certain preferred embodiments, a three step process may be utilized to fill the gaps between wiring lines. The first step includes the deposition of a substantially conformal first dielectric layer with a first sputter component over the tops and sides of the wiring lines and over the substrate between wiring lines. The second step includes the deposition of a second dielectric layer using HDPCVD over the first dielectric layer, the second step being carried out using a greater sputter component than the first step. The sputter component acts to remove the first dielectric layer from areas near the top of the wiring lines. The dielectric material removed from near the top of the wiring lines tends to then be distributed in the gap. A third step includes the deposition of a third dielectric layer using HDPCVD over the second dielectric layer, the third step being carried out using a greater sputter component than the second step in order to more quickly fill the gap. The first and second layers over the wiring lines protect the underlying wiring lines from being etched and provides dielectric material that will fill the gap as it is etched away from regions near the top of the wiring lines. A more detailed description of HDPCVD is presented below.

High density plasma chemical vapor deposition (HDPCVD) systems have been developed which are capable of providing high quality dielectric layers at deposition temperatures significantly reduced from conventional CVD of dielectric layers. HDPCVD systems are commercially available (for example, from Novellus Systems, Inc.), which deposit a dielectric layer having superior density, moisture resistance and planarization properties as compared to conventional CVD dielectric layers. The high density plasma, which mediates deposition in HDPCVD systems, may be generated from a variety of sources such as electron cyclotron resonance, inductively coupled plasma, helicon, and electrostatically shielded radio frequency. All of these plasma generation mechanisms allow for the addition and independent control of a bias sputter component to the deposition process. Manipulating the relative substrate bias can alter the deposition conditions, altering the energy of the CVD precursor gases and the extent of etching and sputtering processes that occur during deposition in a manner that makes it possible to achieve substantially void-free gap filling with enhanced planarization in an intermetal dielectric deposition process. The bias sputter component can introduce an etching component to the deposition process which can be controlled to remove or prevent the build-up of the deposited dielectric material on the upper portions of the wiring line sidewalls during deposition. Such a build-up is observed when other deposition methods such as PECVD are used to fill small gaps with oxides. Formation of such build-ups on the sidewalls of wiring lines can lead to the inclusion of voids in the intermetal dielectric material. Eliminating such voids, or gaining control over the void formation process, is desirable to reduce the impact that voids in intermetal dielectrics can have on future processing.

As seen in FIG. 1, an oxide layer 10 deposited on substrate 12 using PECVD TEOS will build up on the upper corner regions of the sidewalls of wiring lines 14 and form overhang regions 15. As the deposition proceeds and the gap is filled, voids 16 between the wiring lines 14 can be formed, as shown in FIG. 2. These voids 16 may create channels that run parallel to adjacent wiring lines 14 along their length. These channels may open adjacent the end of wiring lines or in locations where the dielectric lies in a bend between adjacent wiring lines. Planarization may uncover the voids and materials such as polishing chemicals or polymerized etch byproducts may become trapped in the voids in a manner that may be very difficult to remove. Subsequent processing steps exhibit reduced yields due to contamination from the materials trapped in the voids. When utilizing the HDPCVD method of the present invention, the bias sputter component of the method accelerates ions such as argon within the deposition chamber to bombard the deposition substrate. Such a non-reactive, ion-milling process removes material that deposits excessively on the sidewalls of the wiring lines, preventing formation of an overhang into the gap. When, as in the present invention, the deposition process is controlled to prevent overhangs, the process of filling gaps with dielectric is less likely to enclose voids within the dielectric.

The bias sputtering component of HDPCVD derives from the introduction of an accelerating potential between the plasma-excited deposition gases and the deposition substrate. Such an acceleration potential may arise differently in different geometry systems. Commonly, part of the acceleration potential derives from the dc self-bias effect whereby a substrate held at a fixed potential develops a self-bias with respect to an adjacent plasma. The level of dc acceleration potential can be varied by varying the potential to which the substrate is tied. In most HDPCVD systems, an additional, independently variable rf bias is typically provided between one or more plates and the substrate. This independent rf bias allows for more complete control of the accelerating bias and the sputtering rate and helps to prevent the uneven charge build-up possible in a purely self-biased system.

The ions accelerated through the bias sputter component of HDPCVD processes etch the material present on the surface of the deposition substrate and sputter that etched material, generally to further recessed portions (i.e., farther from the ion flux) on the substrate. As an oxide is deposited onto the surface of a substrate by HDPCVD incorporating bias sputtering, the oxide is also etched from the surface of the substrate and sputtered into recessed portions of the substrate. Typically, the ions that are most prevalent in the bias sputtering process are relatively inert argon ions, so comparatively little of the process proceeds through chemical mechanisms and the process primarily proceeds through a physical transport mechanism. The etch rate of oxide HDPCVD processes varies as a function of the angle of incidence of the etching ions, with normally incident ions etching at a slower rate than ions that are incident at higher angles. The effect of this angular dependence of the bias sputter component of HDPCVD is that the edges of structures are etched at a faster rate than the central portions of the structures. As such, those portions of a deposited layer that are closest to a gap are the most likely to be etched and sputtered into the gap. This produces the well known surface faceting of the HDPCVD process and the ability of the process to fill gaps effectively.

It should be recognized that any plasma based process can exhibit sputter etching and deposition mechanisms. When the present inventors discuss sputtering rates in HDPCVD processes, the present inventors intend to convey a sputtering rate in comparison to a base line level of sputtering characteristic of a process such as PECVD.

Another advantage of the HDPCVD is that it is generally not necessary to perform subsequent high temperature densification steps, which may sometimes be required to densify oxide layers deposited using conventional CVD and other techniques. Use of HDPCVD processes desirably reduces the number of process steps for making a device and minimizes exposure of the device to elevated temperatures. Embodiments of the present invention may include a gap filling procedure that has at least two and more preferably three distinct steps of depositing materials under different conditions to fill the gaps between wiring lines without adverse effects on the wiring lines.

HDPCVD processes may accomplish both deposition and etching at the same time, depending on the level of bias sputter component chosen for the deposition environment during the process. Bias sputtering removes and redistributes dielectric material from wiring line sidewalls and enables substantially void-free filling of gaps and enhances planarization. As described above, the sputter component acts to prevent material build-up at the corners of the wiring lines and results in better gap-filling. It should be noted that an excessive etching component during HDPCVD dielectric deposition may damage either wiring lines or one or more of the protective layers that might be provided over the wiring lines. Thus, the sputter component is preferably controlled or other process characteristics are adjusted to protect the wiring lines and desired portions of the intermetal dielectric. Favorable gap-filling with dielectric materials can be accomplished using a three step HDPCVD process as described below in which the etch and sputtering rates are most preferably different in each of the three steps.

It should be appreciated that, while the present invention is described with reference to a particularly preferred embodiment in which three distinct stages of deposition are performed, variations on this process having more stages or even providing continuous variation between different etch and sputtering conditions may be desirable. These more complicated implementations of the present invention are presently less preferred because of their greater complexity and increased process variability. The three layers of the preferred gap fill structure perform particularly desirable functions in the invention's method. A first layer deposited near the wiring lines (or other conductors) is provided that has a high density and a corresponding relatively high level of hardness. Most preferably, the first layer is formed from a silicon rich oxide to provide a hard material for the first layer. The first layer might be deposited in a HDPCVD process having a low bias sputtering component to provide a layer in a substantially conformal manner. A second layer is preferably provided over the first layer at a higher etch to deposition ratio to provide higher gap fill at a desirable deposition rate. A third layer is deposited at a still higher etch to deposition rate, providing a desirable level of gap fill with good planarization. The presently preferred embodiments utilize oxides for each layer within the gap, but it would be possible to utilize other materials if appropriate deposition techniques were available.

Preferred embodiments of the present invention are now described with reference to FIGS. 3–7. FIG. 3 shows a cross-sectional view of a semiconductor substrate having wiring lines 20 formed on a substrate 22. The wiring lines 20 may include wiring line layer 23, which may be formed from a variety of materials, such as aluminum, aluminum alloyed with silicon or copper, copper, alloys including copper and multilayer structures including comparatively inexpensive metals and more expensive metals such as the refractory metals. Between the wiring lines 20 lie gaps 24. The substrate may contain a variety of elements, including, for example, transistors, diodes, and other semiconductor elements (not shown) as are well known in the art. The substrate 22 may also include other metal interconnect layers. Between the substrate 22 and wiring line layer 23 lies surface layer 26. If portions of the surface of the substrate 22 which make contact with the wiring lines are silicon and the wiring line layer 23 is aluminum, then layer 26 may comprise a material such as titanium nitride, titanium-silicide, or a titanium-tungsten alloy. In this configuration, layer 26 acts as a barrier to prevent interactions such as interdiffusion between the silicon and the aluminum. Layer 26 may also act to help adhere the wiring line 20 to the substrate 22 and may reduce electromigration tendencies in the aluminum wiring lines. Protective layer 28, which may be the same material as makes up layer 26, may also be deposited on the wiring line layer 23. The protective layer 28 serves several functions, including protecting the wiring line layer 23, limiting electromigration, providing more reproducible contacts and acting as an antireflective coating under a layer of photoresist in a subsequent photolithography process.

Figure 4:
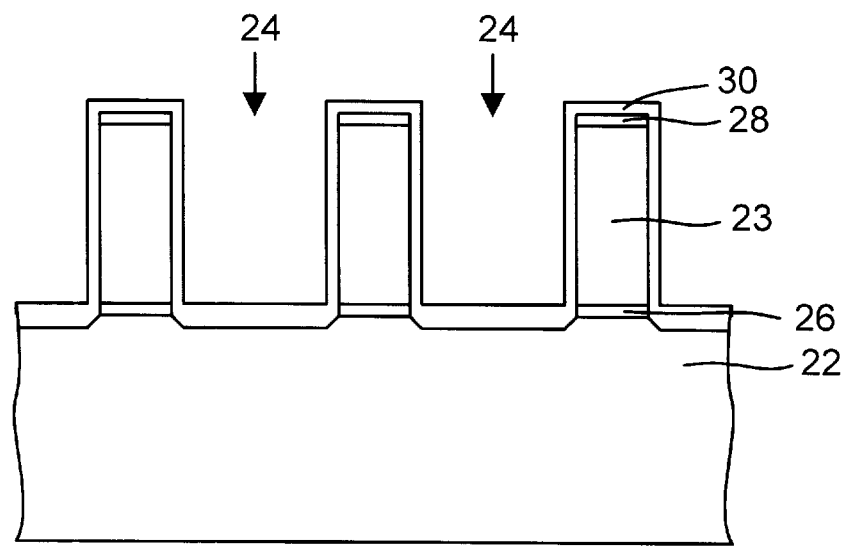

A first HDPCVD step is carried out to form first oxide layer 30, which is a thin layer deposited onto the surface of the substrate 22, onto the sides of the wiring line layer 23, the sides of the layer 26 and the sides and top of protective layer 28, as shown in FIG. 4. This first HDPCVD step is carried out with the substrate 22 being unclamped and unbiased so that there is little or no etching taking place during deposition of the first layer. Such conditions also mean that the deposition is substantially conformal, with poor gap fill capability. The primary purpose of this first step being carried out at a low etch to deposition rate is to form a highly conformal protective coating over the wiring line 20. To this end, it is preferred that a silicon rich oxide (SRO, $SiO_{2-x}$), i.e., a silicon oxide having a greater concentration of silicon than is stoichiometric for silicon dioxide, be used as the first layer. Subsequent HDPCVD steps will utilize increased etching to deposition ratios, and it is desired that the relatively durable layer 30 protect the layer 28 and the wiring line layer 23.

Figure 5:
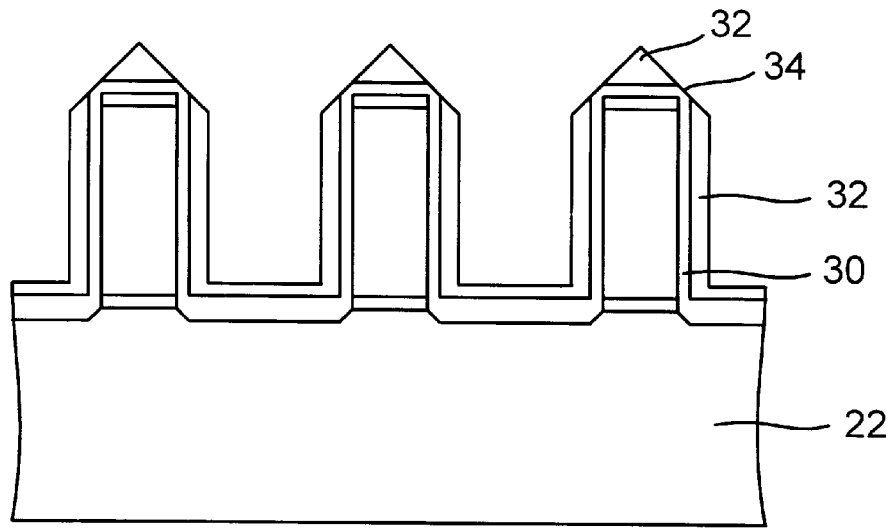

A second HDPCVD step is carried out with the substrate biased to yield a medium etch to deposition rate so that the gap is filled more quickly, while at the same time etching a portion of the second layer above layer 30. This second step yields second HDPCVD oxide layer 32, and preferentially etches back region 34 at the top corners of the first HDPCVD layer 30, as seen in FIG. 5. The second deposition stage provides additional material over the top of the wiring line and provides additional material over the sidewalls of the wiring lines with higher levels of gap filling. Provision of the second layer in this manner improves process throughput and improves process latitude for protecting the wiring lines from the etching aspects of the third stage deposition process. The sputter biased deposition technique is observed to produce a faceted topography on the surface of the deposited material, such as the 45° facets shown in FIG. 5.

Figure 6:
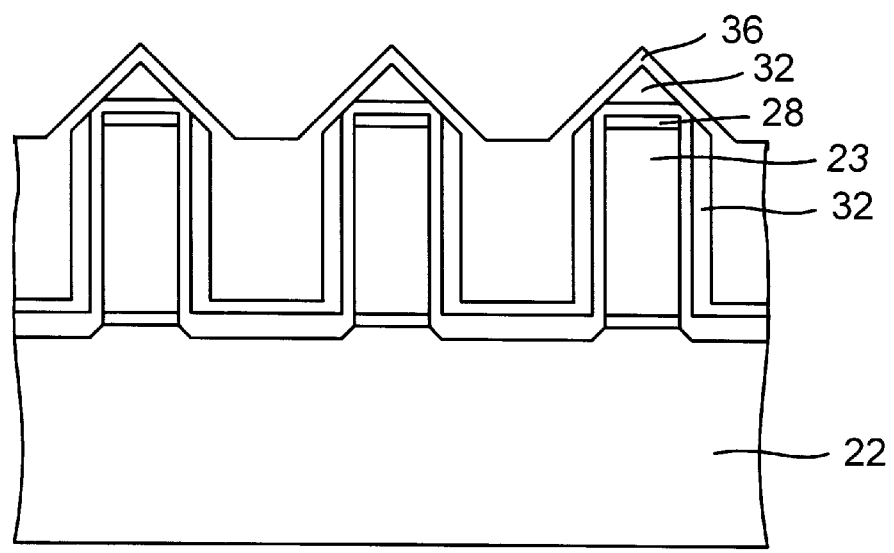
Figure 7:
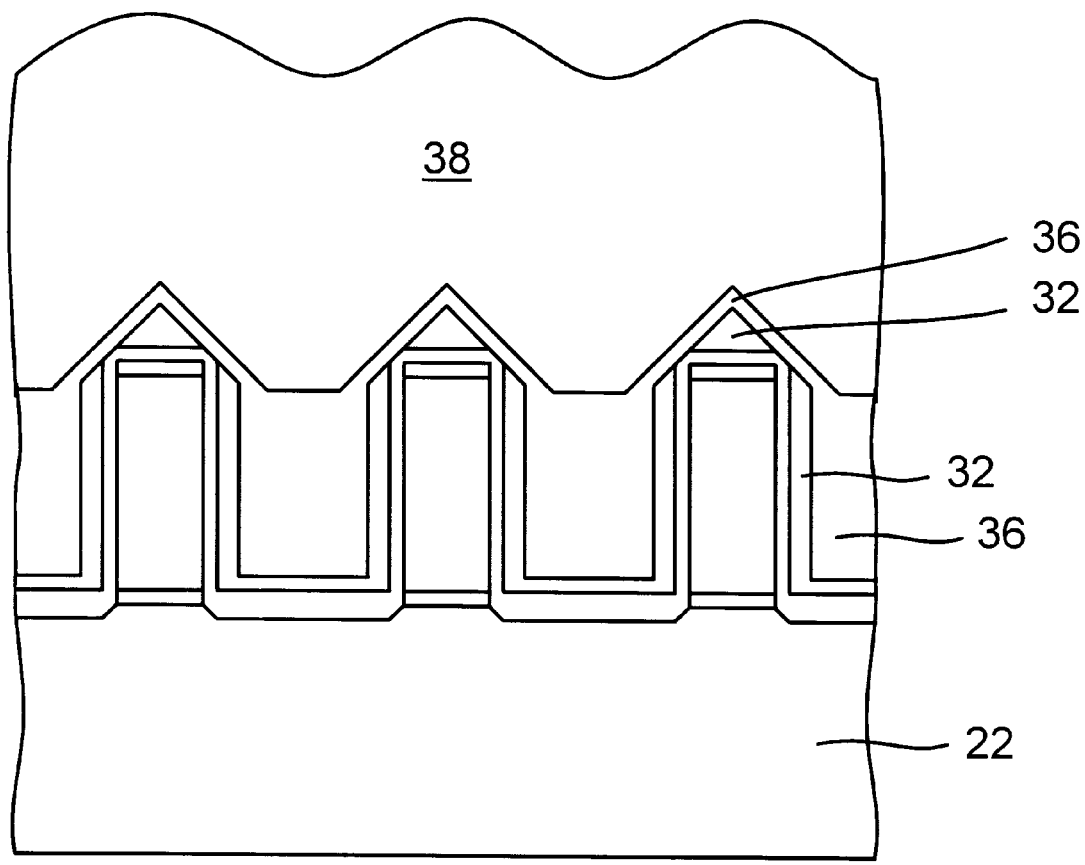

A third HDPCVD step is then carried out with the substrate biased to yield a greater etch to deposition ratio and higher etching and sputtering rates so that the gap 24 becomes filled with third HDPCVD oxide layer 36. The greater etch rate may cause the layer 36 to have a faceted shape above the wiring lines and, as seen in FIG. 6, may not etch through the oxide layers and into the layer 28 or the wiring line layer 23. The gap 24 is substantially filled with a high density oxide having essentially no voids therein. Depending on the subsequent steps to be performed, the area above the top layer of HDPCVD oxide 36 may be further filled with a layer 38 for subsequent processing (FIG. 7). The layer 38 may be selected from a variety of materials and formed using a variety of techniques. Preferably, the layer 38 is an HDPCVD oxide layer or a PECVD oxide layer, which may be deposited at a higher speed than is typical of present HDPCVD processes.

Subsequent processing steps are typically carried out to prepare the structure for the formation of additional layers. In certain preferred embodiments of the present invention, the layer 38 above the wiring lines and gaps may be filled with an HDPCVD oxide. The third step above for depositing HDPCVD oxide layer 36 may be continued so that at least a part of layer 38 is also formed in the same step. As the deposition proceeds, the HDPCVD layer tends to self-planarize. Such a self-planarized layer requires less time for chemical mechanical processing (CMP) than a layer deposited using other, conventional techniques.

In another aspect of the present invention, the first HDPCVD step described above, (which includes the deposition of an HDPCVD dielectric layer without application of a sputter bias component) may be replaced with another dielectric material layer using a PECVD process. This is possible because the first step oxide layer is not intended to fully fill the gap and thus problems relating to void formation when a high aspect ratio gap is filled with a PECVD oxide are less significant. In addition, if the PECVD oxide overhangs the gap, that overhang will be etched during the subsequent HDPCVD steps that utilize a sputter bias component. It is, however, quite difficult to form an acceptably hard PECVD oxide layer for a first layer. As such, if PECVD were used to deposit the first layer, it would be desirable to use a hard material as the first layer, such as silicon oxynitride.

While the present invention has been described with particular emphasis on certain preferred embodiments of the present invention, the present invention is not limited to the particular embodiments described herein. For example, electrical isolation of components other than wiring lines may be accomplished using techniques such as those set forth above. The scope of the present invention is to be determined by the following claims.

What is claimed:

1. A method for depositing dielectric material in the formation of semiconductor device, comprising:
   providing a substrate having a substrate surface;
   providing over the substrate surface a plurality of structures separated from one another by gaps;
   performing a first stage of high density plasma chemical vapor deposition to form a conformal first layer of dielectric material overlaying the structures and within the gaps, including introducing a first accelerating potential between plasma-excited deposition gases and the substrate to produce sputtering of the dielectric material into the gaps at a first rate;
   performing a second stage of high density plasma chemical vapor deposition to form a second layer of dielectric material overlaying the first layer, including introducing a second accelerating potential between plasma-excited deposition gases and the substrate to produce sputtering of the dielectric material, at a second rate greater than the first rate and sufficient to etch a portion of the first layer, and without etching the structures; and
   performing a third stage of high density plasma chemical vapor deposition to form a third layer of dielectric material overlaying the second layer and preferentially filling the gaps, including introducing a third accelerating potential between plasma-excited deposition gases and the substrate to produce sputtering of the dielectric material at a third rate greater than the second rate and sufficient to increase the rate of filing the gaps with the dielectric material, and without etching the structures.

2. The method of claim 1, wherein the gaps between the structures are completely filled with the dielectric material of the first, the second and the third layers.

3. The method of claim 1, wherein at least one of the structures comprises a bottom protective layer, a wiring line, and a top protective layer, wherein the bottom protective layer is disposed between the substrate surface and the wiring line and the wiring line is disposed between the bottom protective layer and the top protective layer.

4. The method of claim 3, wherein the structures include sidewalls facing adjacent gaps and top surfaces, and the first dielectric layer covers the sidewalls and the top surfaces.

5. The method of claim 4, wherein the first dielectric layer includes corner regions disposed on the structures at positions near the intersection of the top surface and the sidewalls.

6. The method of claim 5, wherein the portion of the first dielectric layer that is etched away includes the corner regions.

7. The method of claim 1, wherein the structures include top surfaces and the second dielectric layer includes portions having an angle of approximately 45 degrees with respect to the top surfaces.

8. The method of claim 7, wherein the third dielectric layer includes a portion having an angle of approximately 45 degrees with respect to the top surface.

9. The method of claim 1, wherein the first sputtering rate is substantially zero.

10. The method of claim 1, wherein the first accelerating potential is zero.

11. The method of claim 1, wherein the second stage of high density plasma chemical vapor deposition has a greater etch to deposition ratio than the first stage of high density plasma chemical vapor deposition and the third stage of high density plasma chemical vapor deposition has a greater etch to deposition ratio than the second stage of high density plasma chemical vapor deposition.

12. The method of claim 1, further comprising forming a fourth dielectric layer above the third dielectric layer.

13. The method of claim 12, wherein the fourth dielectric layer is formed using plasma enhanced chemical vapor deposition.

14. The method of claim 12, wherein the fourth dielectric layer is formed using high density plasma chemical vapor deposition.

15. A method of depositing dielectric material in the formation of a semiconductor device, comprising:
   providing over a substrate a plurality of structures separated from one another by gaps;

forming a first layer of dielectric material over the structures and within the gaps;

forming a second layer of dielectric material overlaying the first layer, by performing high density plasma chemical vapor deposition, while introducing an accelerating potential between plasma-excited deposition gases and the substrate to produce sputtering at a first rate sufficient to etch a portion of the first layer, and without etching the structures; and forming a third layer of dielectric material overlaying the second layer and filling the gaps, by performing high density plasma chemical vapor deposition, while introducing an accelerating potential between plasma-excited deposition gases and the substrate to produce sputtering of the dielectric material from the third layer into the gaps at a second rate greater than the first sputtering rate.

16. The method of claim 15, wherein the etch to deposition ratio during formation of the third dielectric layer is greater than the etch to deposition ratio during formation of the second dielectric layer.

17. The method of claim 16, wherein the first dielectric layer is formed using high density plasma chemical vapor deposition.

18. The method of claim 17, wherein the substrate is unbiased during the formation of the first dielectric layer.

19. The method of claim 15, wherein the first dielectric layer is formed using plasma-enhanced chemical vapor deposition.

20. The method of claim 15, wherein at least one of the first, the second and the third dielectric layers comprises an oxynitride material.

21. The method of claim 15, wherein the structures are wiring lines.

22. The method of claim 15, whereby the gaps between structures are filled with dielectric material of the first, the second and the third layers.

* * * * *